(12) United States Patent
Tseng et al.

(10) Patent No.: US 6,286,825 B1
(45) Date of Patent: Sep. 11, 2001

(54) WAFER HOLDER

(75) Inventors: Chien-Kun Tseng, Hsin-Chu; Jui-Hong Lee, Kaohsiung; Shih-Chou Ho; Shih-Wei Fan, both of Taipei, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/590,719

(22) Filed: Jun. 8, 2000

(51) Int. Cl.[7] .................................................. B23Q 3/00
(52) U.S. Cl. ............................ 269/287; 269/21; 269/903; 451/365; 451/364
(58) Field of Search .......................... 269/21, 903, 900, 269/285, 287; 451/364–365

(56) References Cited

U.S. PATENT DOCUMENTS

| | | | |
|---|---|---|---|
| 5,280,894 | 1/1994 | Witcraft et al. | 269/287 |
| 5,589,003 | 12/1996 | Zhao et al. | 118/728 |
| 5,853,169 | 12/1998 | Hern et al. | 269/21 |
| 5,975,183 | 11/2000 | Reis et al. | 269/21 |
| 6,068,547 | 5/2000 | Lupi | 269/21 |
| 6,164,633 | 12/2000 | Mulligan et al. | 269/21 |

*Primary Examiner*—Joseph J. Hail, III
*Assistant Examiner*—Lee Wilson

(57) ABSTRACT

A wafer holder is provided which properly protect backside of a wafer, especially when frontside of the wafer is processed, from pollution and mechanical injury. The wafer holder includes a wafer support section having a hole for locating a wafer, a cover covering the wafer but any chip on the wafer is not touched with the cover; one or more fastening devices for fastening the cover on the wafer support section, each the fastening device having a fixed terminal and a movable terminal where the fixed terminal locates on the wafer support section and the movable terminal presses the cover on the wafer support section. Addition, the wafer support section can be part of chamber wall and then it is an optional part of the present wafer holder.

14 Claims, 4 Drawing Sheets

WAFER HOLDER

BOTTOMGROUND OF THE INVENTION

1. Field of the Invention

The present invention relates to a wafer holder. More particularly, the present invention relates to an improved wafer holder that not only fixes a wafer while one surface of the wafer is processed but also effectively protects another surface of the wafer at the same time.

2. Description of the Prior Art

In a contemporary semiconductor fabricating process, a wafer holder not only is used to load/unload a wafer to/from a processing chamber and for stably holding and supporting the wafer during a wafer transfer process, but also is used to fix a wafer in/on a processing chamber as the wafer is processed by this processing chamber. Obviously, different types of wafer holders are required by different process, and new type of wafer holder is required as new process is available.

For example, for most of conventional semiconductor devices, only the frontside of wafer where chips locate on is processed and then the backside of wafer can be slightly damaged with any disadvantage about corresponding semiconductor devices. Thus, wafer holder can directly touch the backside of wafer because it is not necessary to protect the backside. However, for some specific semiconductor devices such as power metal oxide semiconductor transistor, not only the frontside of wafer is processed but also the backside is processed, such as forming a metal layer on total backside as chips are formed on frontside. In this way, it is desired to modifying the wafer by a modified wafer holder that can properly protect total surfaces, frontside and backside, of the wafer.

FIG. 1 qualitatively illustrates a conventional wafer holder that adapted in a chamber, such as chamber for E-beam deposition, and is used to fix a wafer in/on wall of the chamber. However, no wafer is available in FIG. 1. The conventional wafer holder includes wafer support section 11 which has hole 12 for locating a wafer, and both wafer clamp 13 and one or more fastening devices for fastening wafer on/in wafer support section 11. Herein, each fastening device having a 11 fixed terminal 14 locates on wafer support section 11 and a movable terminal 15 that can be used to fasten the wafer. Further, wafer support section 11 can be part of wall of the chamber.

FIG. 2 is fractional cross-sectional illustration about relation between conventional wafer holder and wafer, herein a wafer is held by the conventional wafer holder. As shown in FIG. 2, as wafer 16 is fastened by the conventional wafer holder, movable terminals 15 directly touch wafer 16. Thus, as both surfaces of wafer 16 is required to be processed, movable terminals 15 will induce some mechanical damages on surface of wafer 16. For example, if it is necessary to form a metal layer on the back surface of wafer 16 after chips 17 on frontside are fabricated, movable terminals 15 will damage these chips as backside of wafer 16 faces to inner of chamber and wafer 16 is fastened by wafer clamp 13 and fastening devices. Moreover, even only wafer clamp 13 is used and fastening devices are omitted, the truth that wafer 16 is unshaded still is an unavoidable disadvantage of conventional wafer holder: whenever pollution occurs, such as reveal as of depositing process, surface of wafer 16 will be chemically damaged. For example, when backside of wafer 16 is processed, chips on frontside of wafer 16 will be damaged as unexpected pollution is occurred.

Therefore, it is significantly that conventional wafer holder can not properly protect both surfaces of wafer from mechanical/chemical damage, and then it is desired to develop a new wafer holder for properly protecting both surfaces of wafer.

SUMMARY OF THE INVENTION

Accordingly, it is an object of the present invention to provide a wafer holder which overcomes the problems encountered in the conventional wafer holder.

It is another object of the present invention to provide an improved wafer holder that more effectively protects the wafer under processed and prevents formalized chips on the wafer is damaged.

To achieve the above objects, this invention provides a wafer holder which includes a wafer support section having a hole for locating a wafer; a cover covering wafer, wherein any chip of the frontside of wafer is not touched with cover, and one or more fastening devices for fastening cover on wafer support section, each fastening devices having a fixed terminal and a movable terminal where fixed terminal locates on wafer support section and movable terminal pressed cover on wafer support section.

In addition, the wafer holder may further comprise a bearing structure, such as wafer clamp, which is used to bear the wafer and usually abutting the hole. However, the wafer support section can be part of wall of chamber where the wafer is processed, and then the wafer support section may be an optional element of the present invention.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The above objects, and other features and advantages of the present invention will become apparent after a reading of the following detailed description taken in conjunction with the drawings, in which.

DESCRIPTION OF THE PREFERRED EMBODIMENT

Figure 1:
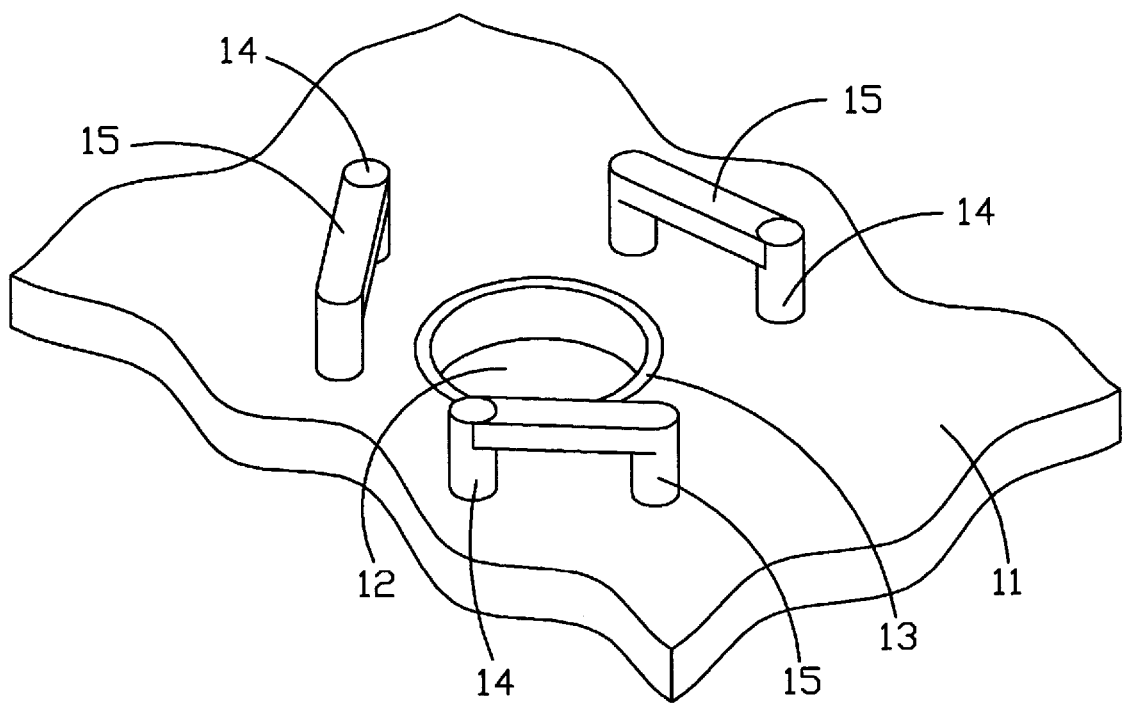
FIG. 1 is a briefly view illustrating a conventional wafer holder.
Figure 2:
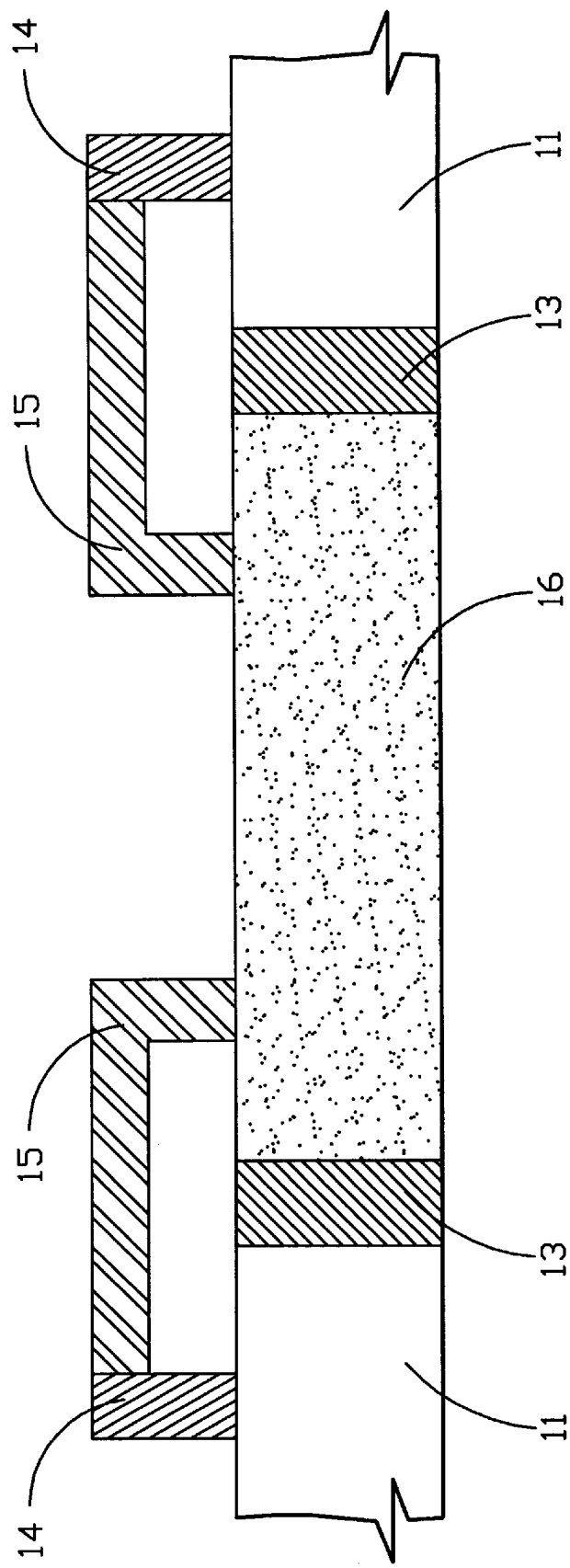
FIG. 2 is fractional cross-sectional illustration about relation between conventional wafer holder and wafer.
Figure 3:
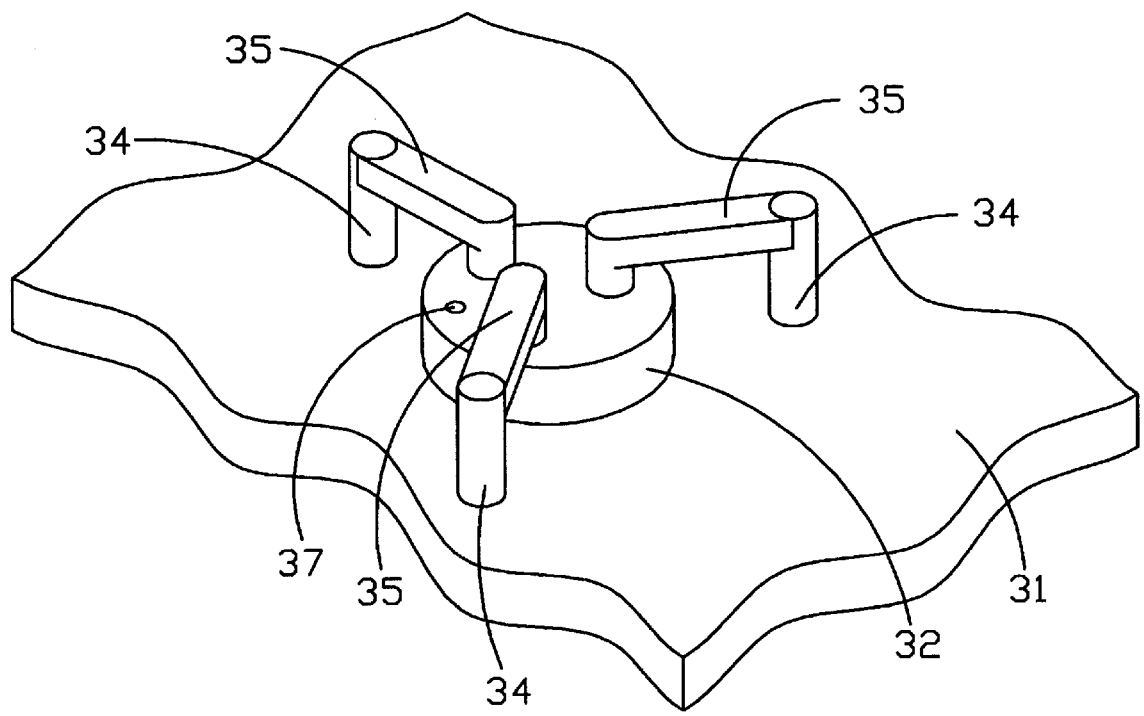
FIG. 3 is a plan view illustrating a wafer holder according to a preferred embodiment of the present invention.
Figure 4:
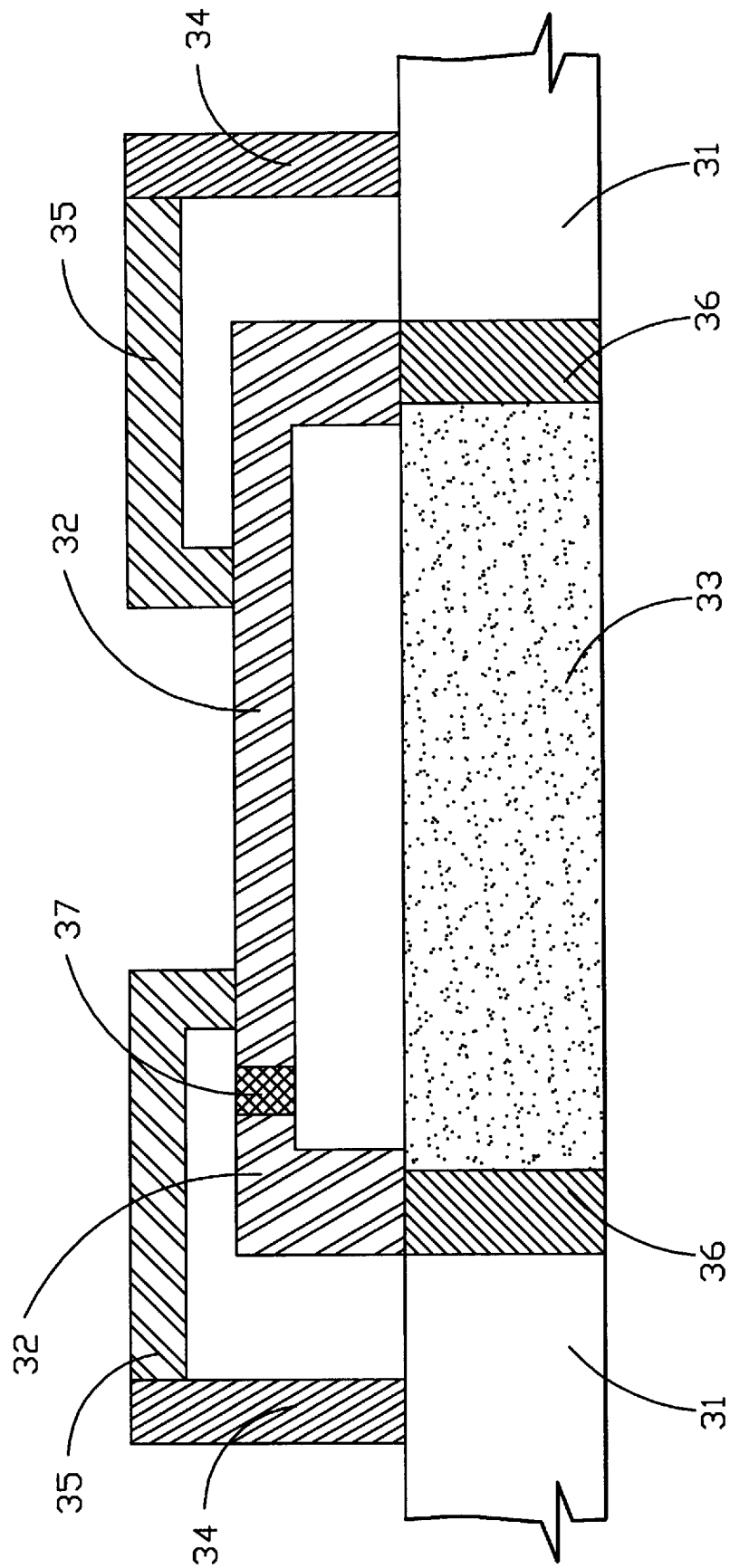
FIG. 4 shows a cross-sectional view of FIG. 3 and illustrates a relation between a loaded wafer and a wafer holder which present by a preferred embodiment of the present invention.

FIG. 3 is a plan view which illustrate a wafer holder according to a preferred embodiment to the present invention. FIG. 4 shows a cross-sectional view of FIG. 3 and illustrates a relation between a loaded wafer a wafer holder which is present by a preferred embodiment of the present invention. Moreover, present wafer holder is a located on wall of chamber and is used to let only backside of wafer is exposed to inner of chamber. In other words, present wafer holding must be able to properly protect frontside of wafer where chips located when backside of wafer is processed.

As shown in FIGS. 3 and 4, wafer holder according to a preferred embodiment of the present invention includes wafer support section 31, cover 32 and one or more fastening devices. Herein, cover 32 covers a wafer and is pressed by the fastening devices.

Wafer support section 31 includes a hole for locating wafer 33. Because hole is filled by wafer 33 and wafer is covered by cover 32, it is not shown in FIG. 3 but is shown in FIG. 4 wherein position of wafer 33 is position of the hole. However, it is not necessary for wafer 33 to fill total hole and it is possible that thickness of wafer 33 is less than depth of the hole and then wafer 33 only fills part of the hole. Further, whenever present wafer holder is used to fix wafer 33 on wall of any chamber, wafer support section 31 can be a part of wall of chamber and then it is an optional element of the present wafer holder.

Moreover, in order to protect chips 38 on wafer 33, cover 32 must only touch edge of wafer 33 or even does not touch with wafer 33 but directly touches wafer support section 11. In other words, cover 32 does not touch any chip on frontside of wafer 33 and then mechanical damage induced by cover 32 can be prevented. Further, available materials of cover 32 includes metal and plastic.

Furthermore, fastening devices are used to fasten cover 32 on wafer support section 31. Each fastening device includes a fixed terminal 34 and a movable terminal 35, where fixed terminal 34 locates on wafer support section 31 and movable terminal 35, such as stretch bar, presses cover 32 on wafer support section 31. Obviously, because that wafer 33 under cover 32 is not touched by the fastening devices, wafer 33 can be protected from any damage induced by fastening devices, such as crush and scratch.

Additional, though FIG. 3 shows the case that three fastening devices are used and these fastening devices are arranged as an isosceles triangles, but the present invention is not limited by it. Number and configuration of fastening devices are changeable and are designed case by case.

Certainly, to rightly fasten wafer 33 in/on the present wafer holder, wafer support section 31 can further include bearing structure 36, such as wafer clamp, which abuts the hold. Herein, bearing structure 36 is used to bear the wafer, Further, in order to protect chips 38, bearing structure 36 is not touched with any chip on wafer 33. Moreover, cover 32 and bearing structure 36 usually do not located on same side of wafer support section 31.

Besides, it is possible that wafer support section 31 further comprises a lock (not shown) for further fastening the wafer. Lock us locked when wafer 33 is put in present wafer holder and is released when it is necessary to move wafer 33 away. Further, when present wafer holder is used to fasten wafer 33 on wall of a chamber, cover 32 further includes airhole 37 that is sealed when the chamber is vacuum and is released for breaking vacuum. Obviously, because inner of chamber usually is vacuum during semiconductor fabricating process, airhole 37 is required to load/unload wafer 33 into/out of the present wafer holder.

Significantly, because that wafer 33 is covered by cover 32, and more exactly, surface of wafer 33 with chips 38 are covered and overcastted by cover 32, and is isolated from inner of chamber by both wafer support section 31 and wafer 33. Thus, the surface with chips is properly isolated from any pollution source, and chemical damage is effectively prevented.

However, it should be emphasized that though the preferred embodiment focuses on protection of surface where chips locate, but the present invention is not limited by it. Because that one surface of a wafer can be protected by the present invention when another surface of wafer is processed, the present invention can be used to protect any wafer that both surfaces requires to be processed.

Moreover, since the main difference between the present wafer holder and conventional wafer holder only is the application of cover 32, and cover 32 is located outside wall of chamber. Naturally, the present wafer holder can be simply acquired form conventional wafer holder by simply modification. In other words, the present is a manufacturable and practical wafer holder.

The present invention is not limited to the above-described embodiment. Various changes and modifications may be effected by one having ordinary skill in the art and remain within the scope of the invention, as defined by the appended claims.

What is claimed is:

1. A wafer holder for protecting a frontside of a wafer when a backside of the wafer is processed, comprising:
   a wafer support section having a hole for locating a wafer;
   a cover for covering said frontside of said wafer, wherein any chip on said frontside of said wafer is not touched with said cover; and
   at least one fastening devices for fasting said cover on said wafer support station, each said fastening device having a fixed terminal support section which is located on said wafer support section and a movable terminal which presses said cover on said wafer support section.

2. The wafer holder recited in claim 1, wherein said wafer support section further comprises a bearing structure abutting said hole, wherein said bearing structure is used to bear said wafer.

3. The wafer holder recited in claim 2, wherein said bearing structure comprises a wafer clamp.

4. The wafer holder recited in claim 2, wherein said bearing structure is not touched with any chip on said wafer.

5. The wafer holder recited to claim 1, wherein said cover comprises an airhole when said wafer holder is used to fasten said wafer on wall of a chamber, said airhole being sealed when said chamber is vacuum.

6. The wafer holder recited to claim 5, wherein said sealed airhole is released for breaking vacuum.

7. The wafer holder recited to claim 1, wherein available materials of said cover comprise metal.

8. The wafer holder recited to claim 1, wherein said movable terminal is a stretch bar.

9. A wafer holder for fastening a wafer, comprising:
   a wafer clamp, wherein said wafer clamp is used to bear said wafer in a hole of a chamber wall of a chamber;
   a cover for covering said wafer from the outside of said chamber, wherein any chip on said wafer is not touched with said cover; and
   a plurality of fastening devices for fastening said cover on a outside surface of said chamber wall, each said fastening device having a fixed terminal and a movable terminal where said fixed terminal locates on said chamber wall and said movable terminal presses said cover on said chamber wall.

10. The wafer holder recited to claim 9, wherein said cover comprises an airhole which is sealed when said wafer is put in a vacuum surrounding.

11. The wafer holder recited to claim 10, wherein sealed said airhole is released for breaking vacuum.

12. The wafer holder recited to claim 9, wherein available materials of said cover comprise metal.

13. The wafer holder recited to claim 9, wherein available materials of said cover comprise plastic.

14. The wafer holder recited to claim 9, wherein said movable terminal is a stretch bar.

* * * * *